United States Patent
Lu et al.

(10) Patent No.: US 7,381,442 B2
(45) Date of Patent: *Jun. 3, 2008

(54) POROGENS FOR POROUS SILICA DIELECTRIC FOR INTEGRAL CIRCUIT APPLICATIONS

(75) Inventors: Victor Y. Lu, Santa Cruz, CA (US); Roger Y. Leung, San Jose, CA (US); Eric Deng, Fremont, CA (US); Songyuan Xie, Newark, CA (US)

(73) Assignee: Honeywell International Inc., Morristown, NJ (US)

( * ) Notice: Subject to any disclaimer, the term of this patent is extended or adjusted under 35 U.S.C. 154(b) by 669 days.

This patent is subject to a terminal disclaimer.

(21) Appl. No.: 10/507,411

(22) PCT Filed: Apr. 10, 2002

(86) PCT No.: PCT/US02/15255

§ 371 (c)(1),
(2), (4) Date: Sep. 13, 2004

(87) PCT Pub. No.: WO03/088343

PCT Pub. Date: Oct. 23, 2003

(65) Prior Publication Data

US 2005/0123735 A1    Jun. 9, 2005

(51) Int. Cl.
*B05D 3/02* (2006.01)
(52) U.S. Cl. .............. 427/96.1; 427/243; 427/244; 427/245; 427/246; 427/247; 427/387
(58) Field of Classification Search .............. 427/96.1, 427/243, 244, 245, 246, 247, 387
See application file for complete search history.

(56) References Cited

U.S. PATENT DOCUMENTS

| | | | |
|---|---|---|---|
| 6,022,812 A | 2/2000 | Smith et al. | 438/761 |
| 6,037,275 A | 3/2000 | Wu et al. | 438/780 |
| 6,063,714 A | 5/2000 | Smith et al. | 438/778 |
| 6,093,636 A | 7/2000 | Carter et al. | 438/623 |
| 6,126,733 A | 10/2000 | Wallace et al. | 106/287.16 |
| 6,204,202 B1 | 3/2001 | Leung et al. | 438/781 |
| 6,208,014 B1 | 3/2001 | Wu et al. | 257/629 |
| 6,225,367 B1 | 5/2001 | Chaouk et al. | 521/149 |
| 6,685,983 B2 * | 2/2004 | Hawker et al. | 427/96.2 |
| 2001/0038919 A1 | 11/2001 | Berry, III et al. | 428/446 |

FOREIGN PATENT DOCUMENTS

| | | |
|---|---|---|
| EP | 1 035 183 | 9/2000 |
| EP | 1 088 848 | 4/2001 |
| EP | 1 142 832 | 10/2001 |
| WO | WO 00/13220 | 3/2000 |
| WO | WO 01/86709 | 11/2001 |
| WO | WO 02/065534 | 8/2002 |

* cited by examiner

*Primary Examiner*—Erma Cameron

(57) ABSTRACT

The invention relates to the production of nanoporous silica dielectric films and to semiconductor devices and integrated circuits comprising these improved films. The nanoporous films of the invention are prepared using silicon containing pre-polymers and are prepared by a process that allows crosslinking at lowered gel temperatures by means of a metal-ion-free onium or nucleophile catalyst.

38 Claims, No Drawings

POROGENS FOR POROUS SILICA DIELECTRIC FOR INTEGRAL CIRCUIT APPLICATIONS

BACKGROUND OF THE INVENTION

1. Field of the Invention

The present invention relates to the production of nanoporous silica dielectric films and to semiconductor devices and integrated circuits comprising these improved films. The nanoporous films of the invention are prepared using silicon containing pre-polymers and are prepared by the use of double end-capped porogens to prevent chemical attachment of the porogen to the Si-network. As a result essentially all the available silanol (Si—OH) groups can be cross-linked to give a rigid network before the removal of the porogen, thus producing a nanoporous film with few silanol groups.

2. Description of the Related Art

As feature sizes in integrated circuits are reduced to below 0.15 µm and below, in new generations of electronic devices, problems with interconnect RC delay, power consumption and signal cross-talk have become increasingly difficult to resolve. One of the solutions to overcome these difficulties is to develop materials of dielectric constant less than about 2.5 for interlevel dielectric (ILD) and intermetal dielectric (IMD) applications. While there have been previous efforts to apply low dielectric constant materials to integrated circuits, there remains a longstanding need in the art for further improvements in processing methods and in the optimization of both the dielectric and mechanical properties of such materials used in the manufacture of integrated circuits.

One type of material with a low dielectric constant is nanoporous silica films prepared from silicon containing pre-polymers by a spin-on sol-gel technique. Air has a dielectric constant of 1, and when air is introduced into a suitable silica material having a nanometer-scale pore structure, such films can be prepared with relatively low dielectric constants ("k"). Nanoporous silica materials are attractive because similar precursors, including organic-substituted silanes, such as tetraacetoxysilane (TAS)/methyltriacetoxysilane (MTAS)-derived silicon polymers are used as the base matrix and are used for the currently employed spin-on-glasses ("S.O.G.") and chemical vapor deposition ("CVD") of silica $SiO_2$. Such materials have demonstrated high mechanical strength as indicated by modulus and stud pull data. Mechanical properties can be optimized by controlling the pore size distribution of the porous film. Nanoporous silica materials are attractive because it is possible to control the pore size, and hence the density, mechanical strength and dielectric constant of the resulting film material. In addition to a low k, nanoporous films offer other advantages including thermal stability to 900° C.; substantially small pore size, i.e., at least an order of magnitude smaller in scale than the microelectronic features of the integrated circuit; preparation from materials such as silica and tetraethoxysilane (TEOS) that are widely used in semiconductors; the ability to "tune" the dielectric constant of nanoporous silica over a wide range; and deposition of a nanoporous film can be achieved using tools similar to those employed for conventional S.O.G. processing.

High porosity in silica materials leads to a lower dielectric constant than would otherwise be available from the same materials in nonporous form. An additional advantage, is that additional compositions and processes may be employed to produce nanoporous films while varying the relative density of the material. Other materials requirements include the need to have all pores substantially smaller than circuit feature sizes, the need to manage the strength decrease associated with porosity, and the role of surface chemistry on dielectric constant and environmental stability.

Density (or the inverse, porosity) is the key parameter of nanoporous films that controls the dielectric constant of the material, and this property is readily varied over a continuous spectrum from the extremes of an air gap at a porosity of 100% to a dense silica with a porosity of 0%. As density increases, dielectric constant and mechanical strength increase but the degree of porosity decreases, and vice versa. This suggests that the density range of nanoporous films must be optimally balanced between the desired range of low dielectric constant and the mechanical properties acceptable for the desired application.

Nanoporous silica films have previously been fabricated by a number of methods. For example, nanoporous films have been prepared using a mixture of a solvent and a silica precursor, which is deposited on a substrate suitable for the purpose. Usually, a precursor in the form of, e.g., a spin-on-glass composition is applied to a substrate, and then polymerized in such a way as to form a dielectric film comprising nanometer-scale voids.

When forming such nanoporous films, e.g., by spin-coating, the film coating is typically catalyzed with an acid or base catalyst and water to cause polymerization/gelation ("aging") during an initial heating step. In order to achieve maximum strength through pore size selection, a low molecular weight porogen is used.

U.S. Pat. No. 5,895,263 describes forming a nanoporous silica dielectric film on a substrate, e.g., a wafer, by applying a composition comprising decomposable polymer and organic polysilica i.e., including condensed or polymerized silicon polymer, heating the composition to further condense the polysilica, and decomposing the decomposable polymer to form a porous dielectric layer. This process, like many of the previously employed methods of forming nanoporous films on semiconductors, has the disadvantage of requiring heating for both the aging or condensing process, and for the removal of a polymer to form the nanoporous film. Furthermore, there is a disadvantage that organic polysilica, contained in a precursor solution, tends to increase in molecular weight after the solution is prepared; consequently, the viscosity of such precursor solutions increases during storage, and the thickness of films made from stored solutions will increase as the age of the solution increases. The instability of organic polysilica thus requires short shelf life, cold storage, and fine tuning of the coating parameters to achieve consistent film properties in a microelectronics/integrated circuit manufacturing process.

Formation of a stable porous structure relies on the condition that the porogen removal temperature is higher than the crosslinking temperature (or the gel temperature) of the matrix material. It was found that a stable nanoporous structure of less than 10 nm average pore size diameter cannot be produced when the concentration of the alkali cation such as sodium is below 200-300 parts per billion (ppb) level in the spin-on solution. However, stringent requirement for low metal concentration must be met for IC applications. The general practice is to have metal concentration below 50 ppb in the spin-on solution. Therefore, there is a need to develop a low metal nanoporous silica film that can consistently give dielectric constant less than 2.5 and average pore size diameter less than about 10 nm in diameter.

In the past, in order to achieve maximum strength through pore size selection, low molecular weight polyethylene glycol monomethyl ether was chosen as the porogen. Formation of a stable porous structure relies on the condition that the porogen removal temperature is higher than the cross-linking temperature (or the gel temperature) of the matrix material. It was observed that such porogen could chemically react with the Si-network, capping the free silanol groups that are involved in crossing linking reactions during the process. Such species decompose to give unwanted isolated Si—OH groups after the final curing stage that is taken place at a much higher temperature. The changes in hydrophilicity resulting from silanol groups detrimentally impact the dielectric properties. Thus, in order to obtain dielectric materials with low and stable k values, it is desirable to minimize the amount of isolated silanol groups present in the final film. Further more, having free silanol groups also leads to un-desirable out-gassing in the IC integration. The stringent requirement for low out-gassing and stable k must be met for IC applications. The general practice is to obtain hydrophobic films. Therefore, there is a need to develop a hydrophobic nanoporous silica film that can consistently give dielectric constant less than 2.2 and absorb as little moisture as possible. Furthermore, it was widely assumed that pores are formed as the result of chemical attachment of porogens onto the silica network.

It has now been found that chemical attachment is not necessary to form porous silica. It has now been found that through the use of a double end-capped polyethylene oxide porogen, the formation of porous silica resulting from a physical blending of porogen and silicon pre-polymer gives a more hydrophobic film as suggested by its lower delta k value between films at ambient and after heating. The effect of double end-capped porogens, such as poly(ethylene glycol)dimethyl ether, is to prevent any chemical attachment of the porogen to the Si-network so that no additional silanol will be generated during the removal of the porogen and the existing silanol groups will be cross-linked to full extent possible, thus producing a nanoporous film with few, if any, silanol groups. Through the additional use of onium ions or nucleophiles the formation of a porous silica network at lower temperature in a low metal spin-on formulation can be facilitated. The effect of the onium ions or nucleophiles is to lower the gel temperature so that the rigid network is set in before the removal of the porogen, thus producing a nanoporous film without the presence of an alkali ion. The function of the porogen is to control the pore size and to readily decompose after the formation of stable pores. Other side-reactions that prevent the extent of the cross-linking of sol-gel reactions are minimized.

SUMMARY OF THE INVENTION

The invention provides a method of producing a nanoporous silica dielectric film comprising
(a) preparing a composition comprising a silicon containing pre-polymer, a metal-ion-free catalyst selected from the group consisting of onium compounds and nucleophiles; and a porogen which does not bond to the silicon containing pre-polymer;
(b) coating a substrate with the composition to form a film,
(c) crosslinking the composition to produce a gelled film, and
(d) heating the gelled film at a temperature and for a duration effective to remove substantially all of said porogen.

The invention also provides a nanoporous dielectric film produced on a substrate by the above method, as well as a semiconductor device, such as an integrated circuit comprising the nanoporous dielectric film.

The invention also provides porogen which do not bond to a silicon containing pre-polymer selected from the group consisting of poly(alkylene)diether, poly(arylene)diether, poly(cyclic glycol)diether, Crown ethers, fully end-capped polyalkylene oxides, fully end-capped polyarylene oxides, polynorbene, and combinations thereof.

The invention further provides a composition comprising a silicon containing pre-polymer, and a porogen which does not bond to the silicon containing pre-polymer and is selected from the group consisting of poly(alkylene)diether, poly(arylene)diether, poly(cyclic glycol)diether, Crown ethers, fully end-capped polyalkylene oxides, fully end-capped polyarylene oxides, polynorbene, and combinations thereof.

The invention still further provides a method of controlling the pore size of a porous silica film, comprising
(a) preparing a composition comprising a silicon containing pre-polymer, a metal-ion-free catalyst selected from the group consisting of onium compounds and nucleophiles; and a porogen;
(b) coating a substrate with the composition to form a film,
(c) crosslinking the composition to produce a gelled film, and
(d) heating the gelled film at a temperature and for a duration effective to remove substantially all of said porogen;

the method comprising using a porogen which does not bond to the silicon containing pre-polymer.

DETAILED DESCRIPTION OF THE PREFERRED EMBODIMENT

Accordingly, nanoporous silica dielectric films having a dielectric constant, or k value, ranging from about 3 or below, preferably about 2.5 or below, can be produced by the methods of the invention. Typically, silicon-based dielectric films, including nanoporous silica dielectric films, are prepared from a composition comprising a suitable silicon containing pre-polymer, blended with a porogen which does not bond to the silicon containing pre-polymer and a metal-ion-free catalyst which may be an onium compound or a nucleophile. One or more optional solvents, other porogens and/or other components may also be included. The dielectric precursor composition is applied to a substrate suitable, e.g., for production of a semiconductor device, such as an integrated circuit ("IC"), by any art-known method to form a film. The composition is then crosslinked, such as by heating to produce a gelled film. The gelled film is then heated at a higher temperature to remove substantially all of the porogen.

The films produced by the processes of the invention have a number of advantages over those previously known to the art, including producing a nanoporous film with few, if any, silanol groups, more silicon methyl groups, improved mechanical strength, that enables the produced film to withstand the further processing steps required to prepare a semiconductor device on the treated substrate, and a low and stable dielectric constant. The property of a stable dielectric constant is advantageously achieved without the need for further surface modification steps to render the film surface hydrophobic, as was formerly required by a number of processes for forming nanoporous silica dielectric films. Instead, the silica dielectric films as produced by the processes of the invention are sufficiently hydrophobic as initially formed.

The processes of the invention provided for a nanometer scale diameter pore size, which is also uniform in size distribution. The resulting nanoporous silica film typically has a dielectric constant of about 3 or below, more typically in the range of from about 1.3 to about 3.0, and most typically from about 1.7 to about 2.5. The film typically has an average pore diameter ranging from about 1 nm to about 30 nm, or more preferably from about 1 nm to about 10 nm and typically from about 1 run to about 5 nm. The film typically has a void volume of from about 5% to about 80% based on the total volume of the film.

It should be understood that the term nanoporous dielectric films, is intended to refer to dielectric films prepared by the inventive methods from an organic or inorganic glass base material, e.g., any suitable silicon-based material. Additionally, the term "aging" refers to gelling, condensing, or polymerization, of the combined silica-based precursor composition on the substrate after deposition. The term "curing" refers to the removal of residual silanol (Si—OH) groups, removal of residual water, and the process of making the film more stable during subsequent processes of the microelectronic manufacturing process. The curing process is performed after gelling, typically by the application of heat, although any other art-known form of curing may be employed, e.g., by the application of energy in the form of an electron beam, ultraviolet radiation, and the like.

Dielectric films, e.g., interlevel dielectric coatings, are prepared from suitable compositions applied to a substrate. Art-known methods for applying the dielectric precursor composition, include, but are not limited to, spin-coating, dip coating, brushing, rolling, spraying and/or by chemical vapor deposition. Prior to application of the base materials to form the dielectric film, the substrate surface is optionally prepared for coating by standard, art-known cleaning methods. The coating is then processed to achieve the desired type and consistency of dielectric coating, wherein the processing steps are selected to be appropriate for the selected precursor and the desired final product. Further details of the inventive methods and compositions are provided below.

A "substrate" as used herein includes any suitable composition formed before a nanoporous silica film of the invention is applied to and/or formed on that composition. For example, a substrate is typically a silicon wafer suitable for producing an integrated circuit, and the base material from which the nanoporous silica film is formed is applied onto the substrate by conventional methods, including, but not limited to, the art-known methods of spin-coating, dip coating, brushing, rolling, and/or spraying. Prior to application of the base materials to form the nanoporous silica film, the substrate surface is optionally prepared for coating by standard, art-known cleaning methods.

Substrates contemplated herein may comprise any desirable substantially solid material. Particularly desirable substrate layers comprise films, glass, ceramic, plastic, metal or coated metal, or composite material. In preferred embodiments, the substrate comprises a silicon or gallium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers. Useful substrates include silicon, silicon nitride, silicon oxide, silicon oxycarbide, silicon dioxide, silicon carbide, silicon oxynitride, titanium nitride, tantalum nitride, tungsten nitride, aluminum, copper, tantalum, organosiloxanes, organo silicon glass, and fluorinated silicon glass. In other embodiments, the substrate comprises a material common in the packaging and circuit board industries such as silicon, copper, glass, and polymers. The circuit board made up of the present composition will have mounted on its surface patterns for various electrical conductor circuits. The circuit board may include various reinforcements, such as woven non-conducting fibers or glass cloth. Such circuit boards may be single sided, as well as double sided. Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("$SiO_2$") and mixtures thereof.

On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. Useful metallic targets for making these lines are taught in commonly assigned U.S. Pat. Nos. 5,780,755; 6,238,494; 6,331,233B1; and 6,348,139B1 and are commercially available from Honeywell International Inc. These lines form the conductors or insulators of an integrated circuit. Such are typically closely separated from one another at distances of about 20 micrometers or less, preferably 1 micrometer or less, and more preferably from about 0.05 to about 1 micrometer. Other optional features of the surface of a suitable substrate include an oxide layer, such as an oxide layer formed by heating a silicon wafer in air, or more preferably, an $SiO_2$ oxide layer formed by chemical vapor deposition of such art-recognized materials as, e.g., plasma enhanced tetraethoxysilane oxide ("PETEOS"), plasma enhanced silane oxide ("PE silane") and combinations thereof, as well as one or more previously formed nanoporous silica dielectric films.

The nanoporous silica film of the invention can be applied so as to cover and/or lie between such optional electronic surface features, e.g., circuit elements and/or conduction pathways that may have been previously formed features of the substrate. Such optional substrate features can also be applied above the nanoporous silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a nanoporous silica film of the invention, during the manufacture of a multilayer and/or multicomponent integrated circuit. In a further option, a substrate bearing a nanoporous silica film or films according to the invention can be further covered with any art known non-porous insulation layer, e.g., a glass cap layer.

The crosslinkable composition employed for forming nanoporous silica dielectric films according to the invention includes one or more silicon containing prepolymers that are readily condensed. It should have at least two reactive groups that can be hydrolyzed. Such reactive groups include, alkoxy (RO), acetoxy (AcO), etc. Without being bound by any theory or hypothesis as to how the methods and compositions of the invention are achieved, it is believed that water hydrolyzes the reactive groups on the silicon monomers to form Si—OH groups (silanols). The latter will undergo condensation reactions with other silanols or with other reactive groups, as illustrated by the following formulas:

Si—OH+HO—Si→Si—O—Si+H₂O

Si—OH+RO—Si→Si—O—Si+ROH

Si—OH+AcO—Si→Si—O—Si+AcOH

Si—OAc+AcO—Si→Si—O—Si+Ac₂O

R=alkyl or aryl

Ac=acyl(CH₃CO)

These condensation reactions lead to formation of silicon containing polymers. In one embodiment of the invention, the prepolymer includes a compound, or any combination of compounds, denoted by Formula I:

Rx-Si-Ly          (Formula I)

wherein x is an integer ranging from 0 to about 2 and y is 4-x, an integer ranging from about 2 to about 4, R is independently alkyl, aryl, hydrogen, alkylene, arylene and/or combinations of these, L is independently selected and is an electronegative group, e.g., alkoxy, carboxyl, halide, isocyanato and/or combinations of these.

Particularly useful prepolymers are those provided by Formula I when x ranges from about 0 to about 2, y ranges from about 2 to about 4, R is alkyl or aryl or H, and L is an electronegative group, and wherein the rate of hydrolysis of the Si-L bond is greater than the rate of hydrolysis of the Si—OCH₂CH₃ bond. Thus, for the following reactions designated as (a) and (b):

(a) Si-L+H₂O→Si—OH+HL (b) Si—OCH₂CH₃+H₂O →Si—OH+HOCH₂CH₃

The rate of (a) is greater than rate of (b).

Examples of suitable compounds according to Formula I include, but are not limited to:

Si(OCH₂CF₃)₄ tetrakis(2,2,2-trifluoroethoxy)silane,

Si(OCOCF₃)₄ tetrakis(trifluoroacetoxy)silane*,

Si(OCN)₄ tetraisocyanatosilane,

CH₃Si(OCH₂CF₃)₃ tris(2,2,2-trifluoroethoxy)methylsilane,

CH₃Si(OCOCF₃)₃ tris(trifluoroacetoxy)methylsilane*,

CH₃Si(OCN)₃ methyltriisocyanatosilane, and or combinations of any of the above.

[* These generate acid catalyst upon exposure of water]

In another embodiment of the invention, the composition includes a polymer synthesized from compounds denoted by Formula I by way of hydrolysis and condensation reactions, wherein the number average molecular weight ranges from about 150 to about 300,000 amu, or more typically from about 150 to about 10,000 amu.

In a further embodiment of the invention, silicon-containing prepolymers useful according to the invention include organosilanes, including, for example, alkoxysilanes according to Formula II:

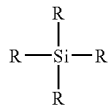

Formula II

Optionally, Formula II is an alkoxysilane wherein at least 2 of the R groups are independently $C_1$ to $C_4$ alkoxy groups, and the balance, if any, are independently selected from the group consisting of hydrogen, alkyl, phenyl, halogen, substituted phenyl. For purposes of this invention, the term alkoxy includes any other organic groups which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

In a further option, for instance, the prepolymer can also be an alkylalkoxysilane as described by Formula I, but instead, at least 2 of the R groups are independently $C_1$ to $C_4$ alkylalkoxy groups wherein the alkyl moiety is $C_1$ to $C_4$ alkyl and the alkoxy moiety is $C_1$ to $C_6$ alkoxy, or etheralkoxy groups; and the balance, if any, are independently selected from the group consisting of hydrogen, alkyl, phenyl, halogen, substituted phenyl. In one preferred embodiment each R is methoxy, ethoxy or propoxy. In another preferred embodiment at least two R groups are alkylalkoxy groups wherein the alkyl moiety is $C_1$ to $C_4$ alkyl and the alkoxy moiety is $C_1$ to $C_6$ alkoxy. In yet another preferred embodiment for a vapor phase precursor, at least two R groups are ether-alkoxy groups of the formula ($C_1$ to $C_6$ alkoxy)$_n$ wherein n is 2 to 6.

Preferred silicon containing prepolymers include, for example, any or a combination of alkoxysilanes such as tetraethoxysilane, tetrapropoxysilane, tetraisopropoxysilane, tetra(methoxyethoxy)silane, tetra(methoxyethoxyethoxy)silane which have four groups which may be hydrolyzed and than condensed to produce silica, alkylalkoxysilanes such as methyltriethoxysilane silane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy)silane, tetrakis(2-ethylethoxy)silane, tetrakis(methoxyethoxy)silane, and tetrakis(methoxypropoxy)silane are particularly useful for the invention.

In a still further embodiment of the invention, the alkoxysilane compounds described above may be replaced, in whole or in part, by compounds with acetoxy and/or halogen-based leaving groups. For example, the prepolymer may be an acetoxy (CH₃—CO—O—) such as an acetoxy-silane compound and/or a halogenated compound, e.g., a halogenated silane compound and/or combinations thereof. For the halogenated prepolymers the halogen is, e.g., Cl, Br, I and in certain aspects, will optionally include F. Preferred acetoxy-derived prepolymers include, e.g., tetraacetoxysilane, methyltriacetoxysilane and/or combinations thereof.

In one particular embodiment of the invention, the silicon containing prepolymer includes a monomer or polymer precursor, for example, acetoxysilane, an ethoxysilane, methoxysilane and/or combinations thereof.

In a more particular embodiment of the invention, the silicon containing prepolymer includes a tetraacetoxysilane, a $C_1$ to about $C_6$ alkyl or aryl-triacetoxysilane and combinations thereof. In particular, as exemplified below, the triacetoxysilane is a methyltriacetoxysilane.

The silicon containing prepolymer is preferably present in the overall composition in an amount of from about 10 weight percent to about 80 weight percent, preferably present in the overall composition in an amount of from about 20 weight percent to about 60 weight percent.

The composition then contains at least one metal-ion-free catalyst which is an onium compound or a nucleophile. The catalyst may be, for example an ammonium compounds, an amine, a phosphonium compound or a phosphine compound. Non-exclusive examples of such include tetraorganoammonium compounds and tetraorganophosphonium compounds including tetramethylammonium acetate, tetramethylammonium hydroxide, tetrabutylammonium acetate, triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof. The composition may comprise a non-metallic, nucleophilic additive which accelerates the crosslinking of the composition. These include dimethyl sulfone, dimethyl formamide, hexamethylphosphorous triamide (HMPT), amines and combinations thereof. The catalyst is preferably present in the overall composition in an amount of from about 1 ppm by weight to about 1000 parts per million (ppm), preferably present in the overall composition in an amount of from about 6 ppm to about 200 ppm.

The composition then contains at least one porogen which is a compound or oligomer or polymer and is selected so that, does not bond to the silicon containing pre-polymer. When it is removed, e.g., by the application of heat, a silica dielectric film is produced that has a nanometer scale porous structure. The scale of the pores produced by porogen removal is proportional to the effective steric diameters of the selected porogen component. The need for any particular pore size range (i.e., diameter) is defined by the scale of the semiconductor device in which the film is employed. Furthermore, the porogen should not be so small as to result in the collapse of the produced pores, e.g., by capillary action within such a small diameter structure, resulting in the formation of a non-porous (dense) film. Further still, there should be minimal variation in diameters of all pores in the pore population of a given film. It is preferred that porogen is a compound that has a substantially homogeneous molecular weight and molecular dimension, and not a statistical distribution or range of molecular weights, and/or molecular dimensions, in a given sample. The avoidance of any significant variance in the molecular weight distribution allows for a substantially uniform distribution of pore diameters in the film treated by the inventive processes. If the produced film has a wide distribution of pore sizes, the likelihood is increased of forming one or more large pores, i.e., bubbles, that could interfere with the production of reliable semiconductor devices.

Furthermore, the porogen should have a molecular weight and structure such that it is readily and selectively removed from the film without interfering with film formation. This is based on the nature of semiconductor devices, which typically have an upper limit to processing temperatures. Broadly, a porogen should be removable from the newly formed film at temperatures below, e.g., about 450° C. In particular embodiments, depending on the desired post film formation fabrication process and materials, the porogen is selected to be readily removed at temperatures ranging from about 150° C. to about 450° C. during a time period ranging, e.g., from about 30 seconds to about 60 minutes. The removal of the porogen may be induced by heating the film at or above atmospheric pressure or under a vacuum, or by exposing the film to radiation, or both.

Porogens which meet the above characteristics include those compounds and polymers which have a boiling point, sublimation temperature, and/or decomposition temperature (at atmospheric pressure) range, for example, from about 150° C. to about 450° C. In addition, porogens suitable for use according to the invention include those having a molecular weight ranging, for example, from about 100 to about 50,000 amu, and more preferably in the range of from about 100 to about 3,000 amu.

Porogens which do not bond to the silicon containing pre-polymer include a poly(alkylene)diether, a poly(arylene)diether, poly(cyclic glycol)diether, Crown ethers, polycaprolactone, fully end-capped polyalkylene oxides, fully end-capped polyarylene oxides, polynorbene, and combinations thereof. Preferred porogens which do not bond to the silicon containing pre-polymer include poly(ethylene glycol)dimethyl ethers, poly(ethylene glycol)bis(carboxymethyl) ethers, poly(ethylene glycol)dibenzoates, poly(ethylene glycol)diglycidyl ethers, a poly(propylene glycol)dibenzoates, poly(propylene glycol)diglycidyl ethers, poly(propylene glycol)dimethyl ether, 15-Crown 5, 18-Crown-6, dibenzo-18-Crown-6, dicyclohexyl-18-Crown-6, dibenzo-15-Crown-S and combinations thereof.

The porogen which does not bond to the silicon containing pre-polymer is preferably present in the overall composition, in an amount ranging from about 1 to about 50 weight percent, or more. More preferably the porogen is present in the composition, in an amount ranging from about 2 to about 20 weight percent.

The composition may optionally contain an additional porogen wherein the additional porogen has a boiling point, sublimation point or decomposition temperature ranging from about 150° C. to about 450° C. Preferably the additional porogen has a molecular weight ranging from about 100 to about 50,000 amu. Preferably the additional porogen comprises a reagent comprising at least one reactive hydroxyl or amino functional group, and said reagent is selected from the group consisting of an organic compound, an organic polymer, an inorganic polymer and combinations thereof. Such additional porogens suitable for use in the processes and compositions of the invention include polymers, preferably those which contain one or more reactive groups, such as hydroxyl or amino.

Within these general parameters, a suitable polymer porogen for use in the compositions and methods of the invention is, e.g., a polyalkylene oxide, a monoether of a polyalkylene oxide, an aliphatic polyester, an acrylic polymer, an acetal polymer, a poly(caprolactone), a poly(valeractone), a poly (methyl methacrylate), a poly (vinylbutyral) and/or combinations thereof. When the porogen is a polyalkylene oxide monoether, one particular embodiment is a $C_1$ to about $C_6$ alkyl chain between oxygen atoms and a $C_1$ to about $C_6$ alkyl ether moiety, and wherein the alkyl chain is substituted or unsubstituted, e.g., polyethylene glycol monomethyl ether, or polypropylene glycol monomethyl ether.

Without meaning to be bound by any theory or hypothesis as to how the invention might operate, it is believed that porogens that are, "readily removed from the film" undergo one or a combination of the following events: (1) physical evaporation of the porogen during the heating step, (2) degradation of the porogen into more volatile molecular fragments, (3) breaking of the bond(s) between the additional porogen and the Si containing component, and subsequent evaporation of the porogen from the film, or any combination of modes 1-3. The porogen is heated until a substantial proportion of the porogen is removed, e.g., at least about 50% by weight, or more, of the porogen is removed. More particularly, in certain embodiments, depending upon the selected porogen and film materials, at least about 75% by weight, or more, of the porogen is removed. Thus, by "substantially" is meant, simply by way of example, removing from about 50% to about 75%, or more, of the original porogen from the applied film.

An additional porogen, when employed, is preferably present in the overall composition, in an amount ranging from about 1 to about 50 weight percent. More preferably the additional porogen, when employed, is present in the composition, in an amount ranging from about 2 to about 20 weight percent.

The overall composition then optionally includes a solvent composition. Reference herein to a "solvent" should be understood to encompass a single solvent, polar or nonpolar and/or a combination of compatible solvents forming a solvent system selected to solubilize the overall composition components. A solvent is optionally included in the composition to lower its viscosity and promote uniform coating onto a substrate by art-standard methods (e.g., spin coating, spray coating, dip coating, roller coating, and the like).

In order to facilitate solvent removal, the solvent is one which has a relatively low boiling point relative to the boiling point of any selected porogen and the other precursor components. For example, solvents that are useful for the processes of the invention have a boiling point ranging from about 50 to about 250° C. to allow the solvent to evaporate from the applied film and leave the active portion of the precursor composition in place. In order to meet various safety and environmental requirements, the solvent preferably has a high flash point (generally greater than 40° C.) and relatively low levels of toxicity. A suitable solvent includes, for example, hydrocarbons, as well as solvents having the functional groups C—O—C (ethers), —CO—O— (esters), —CO— (ketones), —OH (alcohols), and —CO—N-(amides), and solvents which contain a plurality of these functional groups, and combinations thereof.

Without limitation, solvents for the composition include di-n-butyl ether, anisole, acetone, 3-pentanone, 2-heptanone, ethyl acetate, n-propyl acetate, n-butyl acetate, ethyl lactate, ethanol, 2-propanol, dimethyl acetamide, propylene glycol methyl ether acetate, and/or combinations thereof. It is preferred that the solvent does not react with the silicon containing prepolymer component.

The solvent component is preferably present in an amount of from about 10% to about 95% by weight of the overall composition. A more preferred range is from about 20% to about 75% and most preferably from about 20% to about 60%. The greater the percentage of solvent employed, the thinner is the resulting film. The greater the percentage of porogen employed, the greater is the resulting porosity.

In another embodiment of the invention the composition may comprises water, either liquid or water vapor. For example, the overall composition may be applied to a substrate and then exposed to an ambient atmosphere that includes water vapor at standard temperatures and standard atmospheric pressure. Optionally, the composition is prepared prior to application to a substrate to include water in a proportion suitable for initiating aging of the precursor composition, without being present in a proportion that results in the precursor composition aging or gelling before it can be applied to a desired substrate. By way of example, when water is mixed into the precursor composition it is present in a proportion wherein the composition comprises water in a molar ratio of water to Si atoms in the silicon containing prepolymer ranging from about 0.1:1 to about 50:1. A more preferred range is from about 0.1:1 to about 10:1 and most preferably from about 0.5:1 to about 1.5:1.

Those skilled in the art will appreciate that specific temperature ranges for crosslinking and porogen removal from the nanoporous dielectric films will depend on the selected materials, substrate and desired nanoscale pore structure, as is readily determined by routine manipulation of these parameters. Generally, the coated substrate is subjected to a treatment such as heating to effect crosslinking of the composition on the substrate to produce a gelled film.

Crosslinking may be done in step (c) by heating the film at a temperature ranging from about 100° C. to about 250° C., for a time period ranging from about 30 seconds to about 10 minutes to gel the film. The artisan will also appreciate that any number of additional art-known curing methods are optionally employed, including the application of sufficient energy to cure the film by exposure of the film to electron beam energy, ultraviolet energy, microwave energy, and the like, according to art-known methods.

Once the film has aged, i.e., once it is is sufficiently condensed to be solid or substantially solid, the porogen can be removed. The latter should be sufficiently non-volatile so that it does not evaporate from the film before the film solidifies. The porogen is removed in a step (d) by heating the gelled film at a temperature ranging from about 150° C. to about 450° C., preferably from about 150° C. to about 350° C. for a time period ranging from about 30 seconds to about 1 hour. An important feature of the invention is that the step (c) crosslinking is conducted at a temperature which is less than the heating temperature of step (d).

Utility

The present composition may also comprise additional components such as adhesion promoters, antifoam agents, detergents, flame retardants, pigments, plasticizers, stabilizers, and surfactants. The present composition has utility in non-microelectronic applications such as thermal insulation, encapsulant, matrix materials for polymer and ceramic composites, light weight composites, acoustic insulation, anti-corrosive coating, binders for ceramic powders, and fire retardant coating.

The present composition is particularly useful in microelectronic applications as a dielectric substrate material in microchips, multichip modules, laminated circuit boards, or printed wiring boards. The present composition may also be used as an etch stop or hardmask.

The present films may be formed by solution techniques such as spraying, rolling, dipping, spin coating, flow coating, or casting, with spin coating being preferred for microelectronics. Preferably, the present composition is dissolved in a solvent. Suitable solvents for use in such solutions of the present compositions include any suitable pure or mixture of organic, organometallic, or inorganic molecules that are volatized at a desired temperature. Suitable solvents include aprotic solvents, for example, cyclic ketones such as cyclopentanone, cyclohexanone, cycloheptanone, and cyclooctanone; cyclic amides such as N-alkylpyrrolidinone wherein the alkyl has from about 1 to 4 carbon atoms; and N-cyclohexylpyrrolidinone and mixtures thereof. A wide variety of other organic solvents may be used herein insofar as they are able to aid dissolution of the adhesion promoter and at the same time effectively control the viscosity of the resulting solution as a coating solution. Various facilitating measures such as stirring and/or heating may be used to aid in the dissolution. Other suitable solvents include methyethylketone, methylisobutylketone, dibutyl ether, cyclic dimethylpolysiloxanes, butyrolactone, γ-butyrolactone, 2-heptanone, ethyl 3-ethoxypropionate, 1-methyl-2-pyrrolidinone, propylene glycol methyl ether acetate (PGMEA), and hydrocarbon solvents such as mesitylene, xylenes, benzene, and toluene.

The present composition may be used in electrical devices and more specifically, as an interlayer dielectric in an interconnect associated with a single integrated circuit ("IC") chip. An integrated circuit chip typically has on its surface a plurality of layers of the present composition and multiple layers of metal conductors. It may also include regions of the present composition between discrete metal conductors or regions of conductor in the same layer or level of an integrated circuit.

The present films may be used in dual damascene (such as copper) processing and substractive metal (such as aluminum or aluminum/tungsten) processing for integrated circuit manufacturing. The present composition may be used in a desirable all spin-on stacked film as taught by Michael E. Thomas, "Spin-On Stacked Films for Low $k_{eff}$ Dielectrics", *Solid State Technology* (July 2001), incorporated herein in its entirety by reference. The present composition may be used in an all spin-on stacked film having additional dielectrics such as taught by commonly assigned U.S. Pat. Nos. 6,248,457B1; 5,986,045; 6,124,411; and 6,303,733.

Analytical Test Methods

Dielectric Constant: The dielectric constant was determined by coating a thin film of aluminum on the cured layer and then doing a capacitance-voltage measurement at 1 MHz and calculating the k value based on the layer thickness.

Refractive Index: The refractive index measurements were performed together with the thickness measurements using a J. A. Woollam M-88 spectroscopic ellipsometer. A Cauchy model was used to calculate the best fit for Psi and Delta. Unless noted otherwise, the refractive index was reported at a wavelenth of 633 nm (details on Ellipsometry can be found in e.g. "Spectroscopic Ellipsometry and Reflectometry" by H. G. Thompkins and William A. McGahan, John Wiley and Sons, Inc., 1999).

Average Pore Size Diameter: The $N_2$ isotherms of porous samples was measured on a Micromeretics ASAP 2000 automatic isothermal $N_2$ sorption instrument using UHP (ultra high purity industrial gas) $N_2$, with the sample immersed in a sample tube in a liquid $N_2$ bath at 77° K.

For sample preparation, the material was first deposited on silicon wafers using standard processing conditions. For each sample, three wafers were prepared with a film thickness of approximately 6000 Angstroms. The films were then removed from the wafers by scraping with a razor blade to generate powder samples. These powder samples were pre-dried at 180° C. in an oven before weighing them, carefully pouring the powder into a 10 mm inner diameter sample tube, then degassing at 180° C. at 0.01 Torr for >3 hours.

The adsorption and desorption $N_2$ sorption was then measured automatically using a 5 second equilibration interval, unless analysis showed that a longer time was required. The time required to measure the isotherm was proportional to the mass of the sample, the pore volume of the sample, the number of data points measured, the equilibration interval, and the P/Po tolerance. (P is the actual pressure of the sample in the sample tube. Po is the ambient pressure outside the instrument.) The instrument measures the $N_2$ isotherm and plots $N_2$ versus P/Po.

The apparent BET (Brunauer, Emmett, Teller method for multi-layer gas absorption on a solid surface disclosed in S. Brunauer, P. H. Emmett, E. Teller; *J. Am. Chem. Soc.* 60, 309-319 (1938)) surface area was calculated from the lower P/Po region of the N2 adsorption isotherm using the BET theory, using the linear section of the BET equation that gives an $R^2$ fit >0.9999.

The pore volume was calculated from the volume of $N_2$ adsorbed at the relative pressure P/Po value, usually P/Po~0.95, which is in the flat region of the isotherm where condensation is complete, assuming that the density of the adsorbed $N_2$ is the same as liquid $N_2$ and that all the pores are filled with condensed $N_2$ at this P/Po.

The pore size distribution was calculated from the adsorption arm of the $N_2$ isotherm using the BJH (E. P. Barret, L. G. Joyner, P. P. Halenda; *J. Am. Chem. Soc.*, 73, 373-380 (1951)) theory. This uses the Kelvin equation, which relates curvature to suppression of vapor pressure, and the Halsey equation, which describes the thickness of the adsorbed $N_2$ monolayer versus P/Po, to convert the volume of condensed $N_2$ versus P/Po to the pore volume in a particular range of pore sizes.

The average cylindrical pore diameter D was the diameter of a cylinder that has the same apparent BET surface area Sa ($m^2/g$) and pore volume Vp (cc/g) as the sample, so D (nm)=4000 Vp/Sa.

FTIR: FTIR spectra were taken using a Nicolet Magna 550 FTIR spectrometer in transmission mode. Substrate background spectra were taken on uncoated substrates. Film spectra were taken using the substrate as background. Film spectra were then analyzed for change in peak location and intensity.

The following non-limiting examples serve to illustrate the invention.

EXAMPLE 1

This example shows the production of a nanoporous silica with a porogen having reactive end groups. A precursor was prepared by combining, in a 100 ml round bottom flask (containing a magnetic stirring bar), 10 g tetraacetoxysilane, 10 g methyltriacetoxysilane, and 17 g propylene glycol methyl ethyl acetate (PGMEA). These ingredients were combined within an $N_2$-environment ($N_2$ glove bag). The flask was also connected to an $N_2$ environment to prevent environmental moisture from entering the solution (standard temperature and pressure).

The reaction mixture was heated to 80° C. before 1.5 g of water was added to the flask. After the water addition is complete, the reaction mixture was allowed to cool to ambient before 4.26 g of polyethylene glycol monomethylether ("PEO"; MW550 amu) was added as a porogen and stirring continued for another 2 hrs. Thereafter, the resulting solution was filtered through a 0.2 micron filter to provide the precursor solution masterbatch for the next step. The solution was then deposited onto a series of 8-inch silicon wafers, each on a spin chuck and spun at 1000 rpm for 30 seconds. The presence of water in the precursor resulted in the film coating being substantially condensed by the time that the wafer was inserted into the first oven. Insertion into the first oven, as discussed below, took place within the 10 seconds of the completion of spinning. Each coated wafer was then transferred into a sequential series of ovens preset at specific temperatures, for one minute each. In this example, there are three ovens, and the preset oven temperatures were 125° C., 200° C., and 350° C., respectively. The PEO was driven off by these sequential heating steps as each wafer was moved through each of the three respective ovens. Each wafer was cooled after receiving the three-oven stepped heat treatment, and the produced dielectric film was measured using ellipsometry to determine its thickness and refractive index. Each film-coated wafer was then further cured at 425° C. for one hour under flowing nitrogen.

The film has a cure thickness of 6770 Å and a cure refractive index of 1.230. The cured film produced has a Δk % of about 10% (see entry 1 of the following table). In the table, capacitance of the film was measured under ambient conditions (room temperature and humidity). Dielectric constant based on ambient capacitance value is called k ambient. The capacitance of the film was measured again after heating the wafer in a hot plate at 200° C. for 2 minutes in order to drive off adsorbed moisture. Dielectric constant based on the de-moisture capacitance is called k de-gas. The differences of the two k values, calculated from Δk %= $(k_{ambient}-k_{degas})/k_{ambient}*100\%$, is one of the indication on the hydrophobicity of a given film. Various amounts (5.43 and 5.04 g for entry 2 and 3, respectively) of PEO were added to produce nanoporous films of different dielectric constant, and the Δk % is greater than 10%. (See entries 2 and 3 of the following table) Cured films were also measured using FTIR to determine silicon methyl (SiC, v: 1277.4 $cm^{-1}$)-to-silicon oxide (SiO, v: 1055.0 $cm^{-1}$) area ratio. In general, the SiC/SiO ratio appears to be in the range of 0.0250 and 0.0264. The average pore size diameters was 2.1-2.2 nm.

EXAMPLE 2

Example 1 is repeated except this example uses poly (ethylene glycol)dimethyl ether ("DMEPEO"; MW500 amu) as the porogen. This example shows that a more hydrophobic film is obtained. In one case, small amount of methyltriacetoxysilane (MTAS, 2%, see entry 6) was added to the solution to serve as an in-situ surface modifier to make the surface less hydrophilic. Films were deposited onto a wafer by spin coating at 1000 rpm or 1500 rpm. After spin coating, the film was heated in three hot plates at temperatures of 125° C., 200° C. and 350° C., one minute each. After bake, the film was cured under flowing nitrogen at 425° C. for one hour. The results of k, R.I. and SiC/SiO of the post-cure films are listed in the following table. It is shown that the Δk % value is below 8.5%, and SiC/SiO ratio is 0.0282±0.0001. (See entries 4-65) When extra MTAS (2%) was added, the resulting film was significantly more hydrophobic having a Δk % value of 2.2%. (See entry 6).

The amount of porogen is based on a batch size of 10 g tetraacetoxysilane and 10 g methyltriacetoxysilane.

| | Pore size/volume data | |
|---|---|---|
| Entry | Average Pore Size Diameter (nm) | Pore Volume (cc/g) |
| 1 | 2.10 | 0.564 |
| 2 | 2.17 | 0.527 |
| 3 | 2.20 | 0.744 |
| 4 | 2.85 | 0.837 |
| 5 | 3.48 | 0.977 |
| 6 | N/A | N/A |

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method of producing a nanoporous silica dielectric film comprising
   (a) preparing a composition comprising a silicon containing pre-polymer, a metal-ion-free catalyst selected from the group consisting of tetramethylammonium acetate, tetrabutylammonium acetate, tetramethylphosphonium acetate, tetramethylphosphonium hydroxide, triphenylphosphine, trimethylphosphine, trioctylphosphine, and combinations thereof; and a porogen which does not bond to the silicon containing pre-polymer;
   (b) coating a substrate with the composition to form a film,
   (c) crosslinking the composition to produce a gelled film, and
   (d) heating the gelled film at a temperature and for a duration effective to remove substantially all of said porogen.

2. The method of claim 1 wherein the nanoporous silica dielectric film has a pore void volume of from about 5% to about 80% based on the volume or the film.

3. The method of claim 1 wherein the resulting nanoporous silica dielectric film has a dielectric constant of about 3 or below.

4. The method of claim 1 wherein the nanoporous silica dielectric film has an average pore diameter in the range of from about 1 nm to about 30 nm.

5. The method of claim 1 wherein the porogen is selected from the group consisting of a poly(alkylene) diether, a

| Entry | Porogen Type | | Cured Refractive Index | Dielectric Constant | | | SiC/SiO FTIR Ratio |
|---|---|---|---|---|---|---|---|
| | Type | Amount (g)* | | $k_{ambient}$ | $k_{de-gas}$ | Δ k % | |
| 1 | PEO | 4.26 | 1.230 | 2.55 | 2.29 | 10.20 | 0.0264 |
| 2 | PEO | 5.43 | 1.210 | 2.59 | 2.25 | 13.13 | 0.0258 |
| 3 | PEO | 5.04 | 1.225 | 2.49 | 2.18 | 12.45 | 0.0250 |
| 4 | DMEPEO | 5.43 | 1.203 | 2.21 | 2.02 | 8.60 | 0.0280 |
| 5 | DMEPEO | 6.98 | 1.171 | 1.98 | 1.87 | 5.56 | 0.0283 |
| 6 | DMEPEO* | 4.26 | 1.205 | 2.23 | 2.18 | 2.24 | 0.0289 | poly(arylene) diether, poly(cyclic glycol) diether, Crown ethers, polycaprolactone, fully end-capped polyalkylene oxides, fully end-capped polyarylene oxides, polynorbene, and combinations thereof.

6. The method of claim 1 wherein the porogen is selected from the group consisting of a poly(ethylene glycol) dimethyl ether, a poly(ethylene glycol) bis(carboxymethyl) ether, a poly(ethylene glycol) dibenzoate, a poly(ethylene glycol) propylmethyl ether, a poly(ethylene glycol) diglycidyl ether, a poly(propylene glycol) dibenzoate, a poly(propylene glycol) dibutyl ether, a poly(propylene glycol) dimethyl ether, a poly(propylene glycol) diglycidyl ether, 15-Crown 5, 18-Crown-6, dibenzo-18-Crown-6, dicyclohexyl-18-Crown-6, dibenzo-15-Crown-5 and combinations thereof.

7. The method of claim 1 wherein the composition further comprises a non-metallic, nucleophilic additive which accelerates the crosslinking of the composition.

8. The method of claim 1 wherein the composition further comprises a nucleophilic additive which accelerates the crosslinking of the composition, which is selected from the group consisting of dimethyl sulfone, dimethyl formamide, hexamethylphosphorous triamide, amines and combinations thereof.

9. The method of claim 1 wherein the composition further comprises water in a molar ratio of water to Si atoms in said silicon containing pre-polymer ranging from about 0.1:1 to about 50:1.

10. The method of claim 1 wherein the composition comprises a silicon containing pre-polymer of Formula I:

Rx-Si-Ly　　　　　　　　　　　　(Formula I)

wherein x is an integer ranging from 0 to about 2, and y is 4-x, an integer ranging from about 2 to about 4;
R is independently selected from the group consisting of alkyl, aryl, hydrogen, alkylene, arylene, and combinations thereof;
L is an electronegative moiety, independently selected from the group consisting of alkoxy, carboxy, amino, amido, halide, isocyanato and combinations thereof.

11. The method of claim 10 wherein the composition comprises a polymer formed by condensing a pre-polymer according to Formula I, wherein the number average molecular weight of said polymer ranges from about 150 to about 300,000 amu.

12. The method of claim 1 wherein the composition comprises a silicon containing pre-polymer selected from the group consisting of an acetoxysilane, an ethoxysilane, a methoxysilane, and combinations thereof.

13. The method of claim 1 wherein the composition comprises a silicon containing pre-polymer selected from the group consisting of tetraacetoxysilane, a $C_1$ to about $C_6$ alkyl or aryl-triacetoxysilane, and combinations thereof.

14. The method of claim 13 wherein said triacetoxysilane is methyltriacetoxysilane.

15. The method of claim 1 wherein the composition comprises a silicon containing pre-polymer selected from the group consisting of tetrakis(2,2,2-trifluoroethoxy)silane, tetrakis(trifluoroacetoxy)silane, tetraisocyanatosilane, tris(2,2,2-trifluoroethoxy)methylsilane, tris(trifluoroacetoxy)methylsilane, methyltriisocyanatosilane and combinations thereof.

16. The method of claim 1 wherein step (c) comprises a crosslinking which is conducted at a temperature which is less than the heating temperature of step (d).

17. The method of claim 1 further comprising an additional porogen wherein the additional porogen has a boiling point, sublimation point or decomposition temperature ranging from about 150° C. to about 450° C.

18. The method of claim 1 wherein step (c) comprises heating the film at a temperature ranging from about 100° C. to about 250° C., for a time period ranging from about 30 seconds to about 10 minutes.

19. The method of claim 1 wherein step (d) comprises heating the film at temperature ranging from about 150° C. to about 450° C., for a time period ranging from about 30 seconds to about 1 hour.

20. The method of claim 1 further comprising an additional porogen wherein the additional porogen has a molecular weight ranging from about 100 to about 50,000 amu.

21. The method of claim 1 further comprising an additional porogen wherein the additional porogen comprises a reagent comprising at least one reactive hydroxyl or amino functional group, and said reagent is selected from the group consisting of an organic compound, an organic polymer, an inorganic polymer and combinations thereof.

22. The method of claim 1 further comprising an additional porogen wherein the additional porogen is selected from the group consisting of a polyalkylene oxide, a monoether of a polyalkylene oxide, an aliphatic polyester, an acrylic polymer, an acetal polymer, a poly(caprolatactone), a poly(valeractone), a poly(methyl methacrylate), a poly(vinylbutyral) and combinations thereof.

23. The method of claim 1 further comprising an additional porogen wherein the additional porogen comprises a polyalkylene oxide monoether which comprises a $C_1$ to about $C_6$ alkyl chain between oxygen atoms and a $C_1$ to about $C_6$ alkyl ether moiety, and wherein the alkyl chain is substituted or unsubstituted.

24. The method of claim 23 wherein the polyalkylene oxide monoether is a polyethylene glycol monomethyl ether or polypropylene glycol monobutyl ether.

25. The method of claim 1 wherein the porogen is present in the composition in an amount of from about 1 to about 50 percent by weight of the composition.

26. The method of claim 1 wherein the composition further comprises a solvent.

27. The method of claim 1 wherein the composition further comprises solvent in an amount ranging from about 10 to about 95 percent by weight of the composition.

28. The method of claim 1 wherein the composition further comprises a solvent having a boiling point ranging from about 50 to about 250° C.

29. The method of claim 1 wherein the composition further comprises a solvent selected from the group consisting of hydrocarbons, esters, ethers, ketones, alcohols, amides and combinations thereof.

30. The method of claim 26 wherein the solvent is selected from the group consisting of di-n-butyl ether, anisole, acetone, 3-pentanone, 2-heptanone, ethyl acetate, n-propyl acetate, n-butyl acetate, 2-propanol, dimethyl acetamide, propylene glycol methyl ether acetate, and combinations thereof.

31. A nanoporous silica dielectric film formed from a composition comprising a silicon containing pre-polymer, a metal ion free catalyst selected from the group consisting of tetramethylammonium acetate, tetrabutylammonium acetate, tetramethylphosphonium acetate, tetramethylphosphonium hydroxide, triphenylphosphine, trimethylphosphine, trioctylphosphine, and combinations thereof; and a porogen that does not bond to the silicon containing pre-polymer and is selected from the group consisting of poly(alkylene) diether, a poly(arylene) dieter, poly(cyclic glycol) diether, Crown ethers, polycaprolactone, fully end-capped polyalkylene oxides, fully end-capped polyarylene oxides, polynorbene, and combinations thereof, which nanoporous silica dielectric film is produced according to the method of claim 1.

32. A semiconductor device comprising a nanoporous dielectric film of claim 31.

33. The semiconductor device of claim 32 that is an integrated circuit.

34. The nanoporous silica dielectric film of claim 31 wherein said metal-ion-free catalyst is tetramethylammonium acetate.

35. The nanoporous silica dielectric film of claim 31 wherein said silicon containing pre-polymer comprises a combination of acetoxy-based leaving groups.

36. The nanoporous silica dielectric film of claim 35 wherein said silicon containing pre-polymer comprising a combination of acetoxy-based leaving groups comprises tetraacetoxysilane and methyltriacetoxysilane.

37. A nanoporous silica dielectric film of claim 31 wherein said composition is a spin-on composition.

38. In a method of controlling the pore size of a porous silica film, comprising
  (a) preparing a composition comprising a silicon containing pre-polymer, a metal-ion-free catalyst selected from the group consisting of; tetramethylammonium acetate, tetrabutylammonium acetate, tetramethylphosphonium acetate, tetramethylphosphonium hydroxide, triphenylphosphine, trimethylphosphine, trioctylphosphine, and combinations thereof; and a porogen;
  (b) coating a substrate with the composition to form a film,
  (c) crosslinking the composition to produce a gelled film, and
  (d) heating the gelled film at a temperature and for a duration effective to remove substantially all of said porogen;
  the method comprising using a porogen which does not bond to the silicon containing pre-polymer.

* * * * *